(12) United States Patent
Verschueren

(10) Patent No.: US 9,594,541 B2
(45) Date of Patent: Mar. 14, 2017

(54) SYSTEM AND METHOD FOR DETECTING FRO LOCKING

(75) Inventor: Ad Verschueren, Vught (NL)

(73) Assignee: Inside Secure, Aix en Provence (FR)

( * ) Notice: Subject to any disclaimer, the term of this patent is extended or adjusted under 35 U.S.C. 154(b) by 1264 days.

(21) Appl. No.: 12/319,308

(22) Filed: Jan. 6, 2009

(65) Prior Publication Data

US 2010/0171560 A1 Jul. 8, 2010

(51) Int. Cl.
*G06F 7/58* (2006.01)
*H03K 3/84* (2006.01)

(52) U.S. Cl.
CPC ............... *G06F 7/58* (2013.01); *G06F 7/588* (2013.01); *H03K 3/84* (2013.01)

(58) Field of Classification Search
CPC .............. G06F 7/58; G06F 7/588; H03K 3/84
USPC ........................................................ 708/251
See application file for complete search history.

(56) References Cited

U.S. PATENT DOCUMENTS

| | | | | |
|---|---|---|---|---|
| 4,327,440 A * | 4/1982 | Furuya et al. | ................ | 375/317 |
| 4,799,259 A | 1/1989 | Ogrodski | ........................ | 380/46 |
| 4,905,176 A * | 2/1990 | Schulz | ........................... | 708/252 |
| 6,065,029 A | 5/2000 | Weiss | ............................ | 708/251 |
| 6,069,915 A * | 5/2000 | Hulbert | ................ | H04B 1/7075 |
| | | | | 370/517 |
| 6,240,432 B1 | 5/2001 | Chuang et al. | ................ | 708/252 |
| 6,480,072 B1 | 11/2002 | Walsh et al. | .................... | 331/78 |
| 6,580,328 B2 * | 6/2003 | Tan | ........................ | H03L 7/095 |
| | | | | 331/17 |
| 6,807,553 B2 * | 10/2004 | Oerlemans | ..................... | 708/252 |
| 6,947,960 B2 * | 9/2005 | Hars | .............................. | 708/250 |
| 7,149,764 B2 | 12/2006 | Henry et al. | .................... | 708/250 |
| 2002/0112111 A1 * | 8/2002 | Zabinski | ............. | G06F 13/4022 |
| | | | | 710/317 |
| 2002/0156819 A1 * | 10/2002 | Oerlemans | ..................... | 708/252 |
| 2004/0263320 A1 * | 12/2004 | Bardouillet et al. | ........ | 340/146.2 |
| 2007/0162806 A1 * | 7/2007 | Matsumoto et al. | ......... | 714/728 |

FOREIGN PATENT DOCUMENTS

| | | | | |
|---|---|---|---|---|
| EP | 1798638 | 6/2007 | ............... | G06F 7/58 |
| JP | H02162823 A | 6/1990 | | |
| JP | H03204721 A | 9/1991 | | |
| JP | 05-283985 A | 10/1993 | | |
| JP | H10209821 A | 8/1998 | | |
| JP | H10335939 A | 12/1998 | | |
| JP | 2003029963 A | 1/2003 | | |

(Continued)

OTHER PUBLICATIONS

Fechner et al.: "A True Random Number Generator with Built-in Attack Detection", Dependability of Computer Systems, 2008. DepCos-RELCOMEX '08. Third International Conference on, IEEE, Piscataway, NJ, Jun. 26, 2008, pp. 111-118.

*Primary Examiner* — Viva Miller
(74) *Attorney, Agent, or Firm* — Brake Hughes Bellermann LLP

(57) ABSTRACT

The detection of locking of a free running oscillator (FRO) is disclosed, including taking periodic samples of the FRO output, storing each new sample in a sample storage medium, each time a new sample is stored searching the stored samples for at least one repeating pattern, counting consecutive sampling instances in which a repeating pattern is found, and indicating when the count reaches a preselected threshold number.

16 Claims, 2 Drawing Sheets

(56) References Cited

FOREIGN PATENT DOCUMENTS

| | | |
|---|---|---|
| JP | 2005018251 A | 1/2005 |
| JP | 2005033241 A | 2/2005 |
| JP | 2005518046 A | 6/2005 |
| JP | 2005249969 A | 9/2005 |
| JP | 2005318014 A | 11/2005 |
| JP | 2007164434 A | 6/2007 |
| JP | 2008197847 A | 8/2008 |

* cited by examiner

SYSTEM AND METHOD FOR DETECTING FRO LOCKING

BACKGROUND

The output of a so-called "True" Random Number Generator (TRNG) is typically based upon some physical source that exhibits entropy (i.e., randomness), such as the timing of irregular radioactive decay events, or thermal noise across a resistor. One source of randomness is the timing jitter of a Free Running Oscillator (FRO). An advantage of using a FRO as a source of randomness is that it can be built using standard digital circuit technologies, for instance on an Application Specific Integrated Circuit (ASIC). If a FRO circuit is truly running "free" (i.e., the FRO is not locking to periodic signals in its environment), taking periodic samples of the output of the FRO provides a source of randomness which can be used to generate true random numbers.

However, if a FRO does lock to a periodic signal in its environment (or a harmonic of such a signal), the amount of randomness in the samples of the FRO output is reduced. Locking to the sample frequency, or to a higher frequency used to time the sampling, may even completely eliminate the randomness of the samples. If a random number generator uses some form of post-processing of the generated values from the FRO samples, checking the generated random numbers for anomalies by statistical means may not reveal the locking. The post-processed values may still appear to be random, even if they are no longer truly random.

SUMMARY

The detection of locking of a free running oscillator (FRO) is disclosed, including taking periodic samples of the FRO output, storing each new sample in a sample storage medium, each time a new sample is stored searching the stored samples for at least one repeating pattern, counting consecutive sampling instances in which a repeating pattern is found, and indicating when the count reaches a preselected threshold number.

It is to be understood that both the foregoing general description and the following detailed description are exemplary and explanatory and are intended to provide further explanation of the herein disclosed systems and methods.

BRIEF DESCRIPTION OF THE DRAWINGS

The accompanying drawings, which are included to provide a further understanding of the herein disclosed systems and methods and are incorporated in and constitute a part of this specification, illustrate embodiments of the claims and together with the description serve to explain the principles of the claims.

In the drawings.

DETAILED DESCRIPTION

FRO lock detection is accomplished by searching for repeating patterns in consecutive samples of the FRO output. If a repeating pattern of samples is detected, the number of samples that the repeating pattern persists is counted. If that count exceeds a preselected threshold number, it is deemed a lock indication. The lock indication can be used to generate an alarm and/or to adjust the operation of a FRO, such as by changing its operating frequency, restarting it, or shutting it down. Preferably, the threshold number can be changed to control the sensitivity of the detector.

Figure 1:
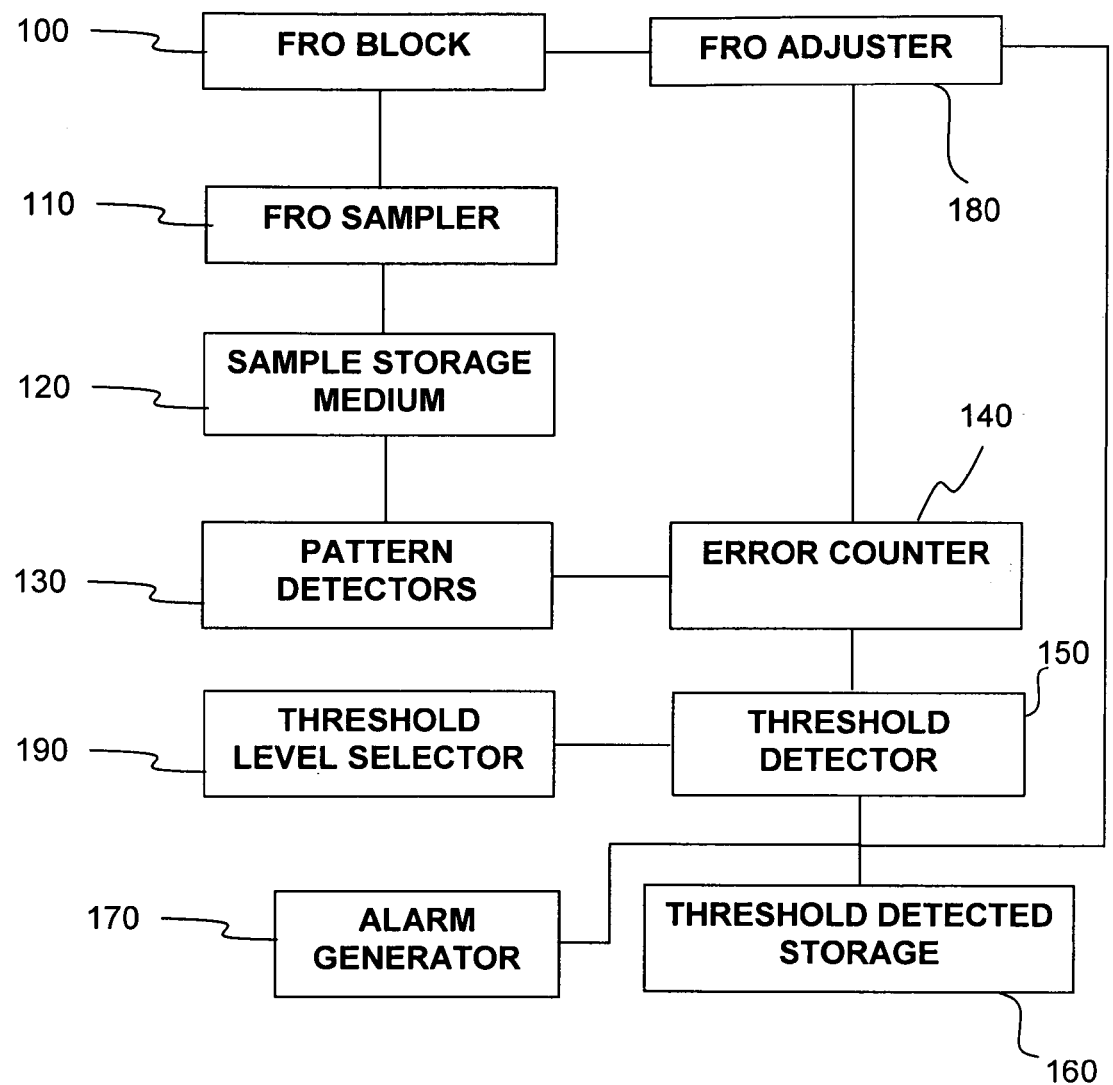
FIG. 1 is a block diagram of a device for detecting locking of a FRO in accordance with the herein disclosed systems and methods.

FIG. 1 shows a block diagram of an exemplary embodiment of a device for detecting locking of a Free Running Oscillator (FRO), such as would occur if the FRO locked on to a periodic signal in its environment. FRO block 100 includes a FRO, the output of which can be used as a source of entropy, for example, for generating random numbers. U.S. Pat. No. 6,807,553, owned by the same assignee as this application, describes one example of a device comprising a plurality of FROs from which random numbers are generated. The output of FRO block 100 is operatively coupled to the input of FRO sampler 110. Sampler 110 samples the FRO block output at a periodic frequency, such as at the frequency of a sampling clock (not shown). In an embodiment, sampler 110 can include a D-type flip-flop.

The output of FRO sampler 110 is coupled to the input of sample storage medium 120. Sample storage medium 120 can be any type of computer readable storage medium, such as a memory, a register, or the like. In an exemplary embodiment, sample storage medium 120 can include a shift register that holds consecutive samples of the FRO block 100 output, such as in a plurality of cascade connected delay stages. FRO sampler 110 can be the first stage of such a shift register 120. Illustratively, in the exemplary embodiment a sample numbering convention can be used for ease of reference wherein "sample 1" indicates the last sample shifted into the shift register, "sample 2" being the next-to-last sample, etc., although it is appreciated that other numbering conventions can be used.

Pattern detection logic accesses or obtains the samples, such as by operatively coupling sample storage medium 120 to one or more pattern detectors 130. Each pattern detector compares stored samples 1 . . . N with stored samples (N+1) . . . 2N, each detector accessing a different number N of consecutive samples. For example, in a pattern detector in which N=3, most recent samples 1, 2, and 3 are compared with next most recent samples 4, 5, and 6, respectively. In particular, sample 1 is compared with sample 4 for equality, and simultaneously sample 2 is compared with sample 5, and sample 3 is compared with sample 6. If samples 1 and 4 are found to contain the same value, samples 2 and 5 contain the same value, and samples 3 and 6 contain the same value, then samples 1, 2, 3 are identified as repeating the same pattern as samples 4, 5, 6. In an embodiment, XNOR gates can be used to compare samples 1 and 4, 2 and 5, and 3 and 6, respectively. The output of the XNOR gates can be coupled to the input of an AND gate, the output of which will indicate when samples 1, 2, 3 repeat the pattern of samples 4, 5, 6. It is appreciated that N=3 is used as an example, and N can equal any desired value.

In an embodiment, a plurality of pattern detectors are used in parallel, simultaneously comparing a plurality of different numbers of samples N. For example, a first detector with N=3 can be used in conjunction with a second detector with N=4, and/or a third detector with N=5, etc. It is appreciated that any desired combination of detectors with any desired values of N can be used in parallel. The pattern detectors 130 search for a pattern each time a new sample is stored in sample storage medium 120, for example, each time a new sample is shifted into a shift register.

Pattern detectors 130 are operatively coupled to error counter 140. Error counter 140 is incremented when one or more of the pattern detectors detects an instance of a repeating pattern, and is reset to zero when none of the pattern detectors detect an instance of a repeating pattern. Error counter 140 is operatively coupled to a threshold detector 150. Threshold detector 150 compares the value of the error counter with a threshold number. The threshold number can be stored in the threshold detector 150, or in another storage location accessible to threshold detector 150. Threshold detector 150 can detect when the threshold number is reached. In one embodiment, the threshold number is reached when the error counter 140 equals the threshold number. In another embodiment, the threshold number is reached when the error counter 140 exceeds the threshold number. In either embodiment, threshold detector 150 can comprise a comparator for determining when the threshold is reached. When the threshold number is reached, the output of threshold detector 150 provides a lock indication signal.

Threshold detector 150 can cause an indicator to be stored in threshold detected storage 160 when the threshold number is reached. For example, in an implementation using a comparator circuit to detect when the threshold number is reached, the comparator output will be active only as long as the output of the error counter reaches (i.e., equals or exceeds) the threshold number, and a memory circuit, "flip-flop" circuit, or the like can be used to store an indication that a lock was detected. In one embodiment, when the threshold number is reached an alarm can be generated by alarm generator 170, and/or the FRO within FRO block 100 can be adjusted by FRO adjuster 180. FRO adjuster 180 can adjust the FRO by modifying the operating frequency of the FRO, restarting it, or shutting it down. When FRO adjuster 180 adjusts the FRO, it also causes the error counter 140 to be reset.

Preferably, the threshold number can be changed by threshold level selector 190. A register, memory, or any other computer accessible data storage device can be used to hold the threshold number so that its value can be selected and set for use by the threshold detector. The threshold number can be changed, for example, as desired for a particular application, or during the course of operation in response to greater or lesser number of locks being detected than desired. The threshold number may be changed automatically or manually. A low threshold number (i.e., using a relatively small number of samples to indicate a lock) can make the detector more sensitive (i.e., able to detect a lock more quickly). However, because samples of a genuinely random signal may exhibit what appears to be repetitive behavior, using a low threshold may falsely identify a lock. Therefore, a more sensitive detector may result in a larger number of "false alarms" than a less sensitive detector.

The number of samples stored in the sample storage medium 120 can be selected to supply the pattern detectors with any number of samples deemed sufficient to reliably detect repeating patterns. For example, the number of samples stored can be 24 and pattern detectors can be used that will detect patterns up to 12 samples long, although more or fewer samples can also be used. Furthermore, the number of pattern detectors used, the number N of samples searched for patterns by each detector, and/or the combination of detectors used, can be varied depending on the requirements of a particular application.

Figure 2:
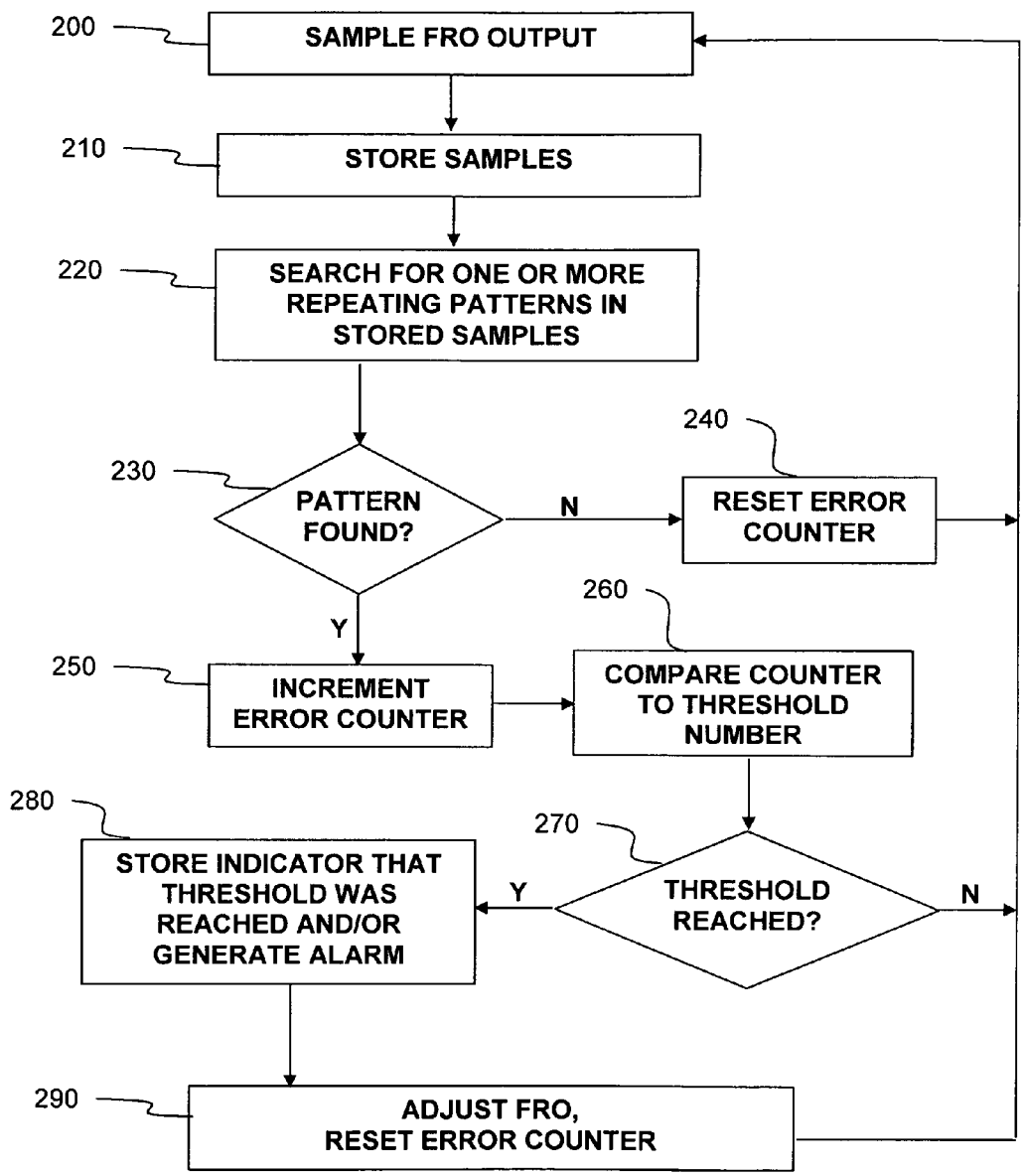
FIG. 2 is a flow diagram of a method of detecting locking of a FRO in accordance with the herein disclosed systems and methods.

FIG. 2 is a flow diagram of a method of detecting locking of a FRO. The output of a FRO is sampled, 200. The samples are stored, 210, such as in a shift register or the like. The stored samples are searched for one or more repeating patterns in stored samples, 220. A determination is made whether a pattern is found, 230. If no repeating patterns are found, then an error counter is reset to zero, 240, and processing reverts back to block 200 and continues from there.

However, if at block 230 one or more repeating patterns are found, the error counter is incremented, 250. The counter count is compared to a threshold number, 260. In one embodiment, the threshold number is reached when the counter equals the threshold number. In another embodiment, the threshold number is reached when the counter count exceeds the threshold number. A determination is made whether the threshold number is reached by the counter, 270. If not, processing reverts back to block 200 and continues from there.

If the threshold number is reached, an indicator that the threshold number was reached can be stored, and/or an alarm can be generated, 280. The FRO can also or alternatively be adjusted and the error counter can be reset, 290. Processing then reverts to block 200 and proceeds from there. In step 290, as previously disclosed the FRO can be adjusted, for example, by modifying its operating frequency, restarting it, or shutting it down. A FRO might be shut down, for example, if it is operating in conjunction with a plurality of FROs to provide entropy for a particular application, such as a TRNG. In one embodiment, a FRO can be shut down if it is found to lock repeatedly after its frequency has been modified and/or it has been restarted a preselected number of times (not shown).

It is noted that a repeating pattern of N bits long can be detected by a pattern detector that detects patterns of length M, wherein M is an integer multiple of N. Thus, in one embodiment, the length of the shift registers in samples storage 120, and the length of pattern detectors 130, can be selected so that they can store samples and detect patterns in a desired number of samples and also in a desired multiple of that number. Moreover, locking of the FRO operating frequency to both integer and non-integer multiples of the sample clock frequency can be detected by using multiple detectors of different lengths. This can help detect locking to clocks other than the sampling clock but operating at a related frequency, for example, in an Application Specific Integrated Circuit (ASIC) wherein multiple clocks are used that have fixed frequency ratios to each other.

For example, in an exemplary implementation, two pattern detectors with N values of 3 samples and 4 samples respectively are used. In such an arrangement, all repeating patterns up to 4 samples long will be detected, including continuous streams of "0" or "1" samples that are detected by both detectors; repeating "10" samples detected by the N=4 detector; repeating "100" and/or "110" samples detected by the N=3 detector; and repeating "1000," "1100", and/or "1110" samples detected by the N=4 detector. In addition to detecting when the FRO locks to the sampling frequency or an integer multiple (i.e., a harmonic) of the sample frequency, this implementation will detect at least the following locking conditions:

the FRO runs at x/2 times the sample frequency (x an integer value>0)—this results in continuous streams of '0' or '1' samples if x is even, and results in repeating '01' sample patterns if x is odd;

the FRO runs at (2x)/3 times the sample frequency (x an integer value>0)—this results in repeating '100' or '110' sample patterns; and the FRO runs at (3x)/4 times the sample frequency (x an integer value>0)—this results in repeating '01' sample patterns if x is even, and results in repeating '0011' sample patterns if x is odd.

Preferably, the operating frequency of the FRO is at least half of the sampling frequency. That is because, if the FRO operates at a much lower frequency than the sampling frequency, consecutive samples will yield the same value, which may lead to false alarms.

Advantageously, because the detection logic is relatively simple, implementing a FRO lock detector for each of a plurality of FROs, for example in a True Random Number Generator, is not excessively costly or complex. Furthermore, the sensitivity of the detector can be modified by changing the threshold number, and the same threshold setting can be used for a plurality of FRO lock detectors operating in parallel.

Moreover, when one or more of the sample points of an actual repeating pattern happen to coincide with edges of the FRO output signal, the values for those samples is unpredictable, and a lock may not be detected. However, because such unpredictable values contribute to sought-after entropy, a lock detect failure in this situation is not problematic.

It is appreciated that various modifications can be made in the disclosed systems and methods without departing from the spirit or scope of the claims. Thus, it is intended that the disclosure cover all such modifications and variations provided they come within the scope of the appended claims and their equivalents.

What is claimed is:

1. A device for detecting locking of a free running oscillator (FRO), comprising:
   a sampler configured to take periodic samples of an output of the FRO;
   a sample storage medium coupled to the sampler and configured to store a plurality of consecutive samples of the output of the FRO;
   a first pattern detector coupled with the sample storage medium, the first pattern detector being configured to, in response to a new sample being stored in the sample storage medium, detect, in the plurality of consecutive samples of the output of the FRO, repeating patterns of a first length;
   a second pattern detector coupled with the sample storage medium in parallel with the first pattern detector, the second pattern detector being configured to, in response to the new sample being stored in the sample storage medium, detect, in the plurality of consecutive samples of the output of the FRO, repeating patterns of a second length, the second length being different than the first length;
   an error counter coupled with the first pattern detector and the second pattern detector, the error counter being configured to count instances of detected repeating patterns;
   a threshold detector coupled to the error counter, the threshold detector being configured to output a FRO lock indication signal when the error counter reaches a preselected number of instances of detected repeating patterns, the preselected number being greater than or equal to one; and
   a FRO adjuster configured to adjust the FRO in response to the FRO lock indication signal.

2. The device of claim 1, wherein the device is embodied on an application specific integrated circuit (ASIC).

3. The device of claim 1, further comprising a data storage configured to store an indication that the preselected number of instances of detected repeating patterns was detected.

4. The device of claim 1, further comprising an alarm generator configured to generate an alarm when the threshold detector indicates the preselected number of instances of detected repeating patterns has been reached.

5. The device of claim 1, wherein adjusting the FRO includes at least one of restarting the FRO, shutting down the FRO, and changing an operating frequency of the FRO.

6. The device of claim 1, further comprising a threshold level selector configured to change the preselected number.

7. The device of claim 1, wherein the sample storage medium includes a shift register.

8. The device of claim 1, wherein:
   detecting, by the first pattern detector or the second pattern detector, repeating patterns includes comparing a respective number of most recent samples of the plurality of consecutive samples of the output of the FRO with a same number of immediately preceding samples of the plurality of consecutive samples of the output of the FRO, and
   incrementing the error counter includes incrementing the error counter when at least one of the first pattern detector and the second pattern detector determines that a pattern of the most recent samples is the same as a pattern of the immediately preceding samples.

9. The device of claim 8, wherein the error counter is configured to reset to zero when neither of the first pattern detector and the second pattern detector detect a repeating pattern in response to the new sample being stored in the sample storage medium.

10. The device of claim 1, wherein an operating frequency of the FRO is greater than or equal to one-half a frequency at which the sampler takes the periodic samples of the output of the FRO.

11. A method of detecting locking of a Free Running Oscillator (FRO), the method comprising:
    periodically sampling an output of the FRO at a sampling frequency;
    storing a plurality of consecutive samples of the output of the FRO in a sample storage medium;
    in response to a new sample being stored:
       detecting, with a first pattern detector, repeating patterns of a first length in the plurality of consecutive samples of the output of the FRO; and
       detecting, with a second pattern detector, repeating patterns of a second length in the plurality of consecutive samples of the output of the FRO;
    in the event at least one repeating pattern is found, counting a number of consecutive sampling instances in which a repeating pattern is found;
    detecting when the count of the number of consecutive sampling instances in which a repeating pattern is found reaches a preselected threshold number;
    in response to the preselected threshold number being reached, outputting an FRO lock indication signal based thereon; and
    adjusting the FRO in response to the FRO lock indication signal.

12. The method of claim 11, further comprising resetting the count of the number of consecutive sampling instances in which a repeating pattern is found to zero in the event repeating patterns are not found.

13. The method of claim 11, further comprising generating an alarm when the count of the number of consecutive sampling instances in which a repeating pattern is found reaches the threshold number.

14. The method of claim 11, further comprising adjusting the FRO by one of restarting the FRO, shutting down the FRO, and changing an operating frequency of the FRO.

15. The method of claim 11, further comprising modifying a sensitivity of the detector by changing the preselected threshold number.

16. The method of claim 11, wherein an operating frequency of the FRO is greater than or equal to the sampling frequency.

* * * * *